United States Patent [19]

Miyazaki et al.

[11] Patent Number: 5,419,969

[45] Date of Patent: May 30, 1995

[54] LOW EMISSIVITY FILM

[75] Inventors: Masami Miyazaki; Eiichi Ando, both of Yokohama, Japan

[73] Assignee: Asahi Glass Company Ltd., Tokyo, Japan

[21] Appl. No.: 799,306

[22] Filed: Nov. 27, 1991

Related U.S. Application Data

[63] Continuation-in-part of Ser. No. 726,263, Jul. 5, 1991.

[30] Foreign Application Priority Data

Jul. 5, 1990 [JP] Japan .................................. 2-176282
Nov. 27, 1990 [JP] Japan .................................. 2-321273
Nov. 29, 1990 [JP] Japan .................................. 2-325914
Jul. 5, 1991 [JP] Japan .................................. 3-191063

[51] Int. Cl.$^6$ ............................................. B32B 15/04
[52] U.S. Cl. .................................... 428/426; 428/212; 428/432; 428/433; 428/469; 428/472; 428/688; 428/689; 428/697; 428/699; 428/702; 359/350; 359/360; 359/577; 359/580; 359/581; 359/582; 359/585; 359/586
[58] Field of Search ............... 428/212, 426, 432, 688, 428/689, 697, 699, 702, 433, 469, 472; 359/350, 360, 577, 580, 581, 582, 585, 586

[56] References Cited

U.S. PATENT DOCUMENTS

| | | | |
|---|---|---|---|
| 2,825,687 | 3/1958 | Preston et al. | 204/192.29 |
| 3,978,272 | 8/1976 | Donley | 428/434 |
| 4,336,120 | 6/1982 | Sakakura et al. | 204/192.18 |
| 4,462,883 | 7/1984 | Hart | 204/192 C |
| 4,462,884 | 7/1984 | Gillery et al. | 204/192.28 |
| 4,565,719 | 1/1986 | Phillips | 428/34 |
| 4,859,532 | 8/1989 | Oyama | 428/469 |
| 4,971,843 | 11/1990 | Michelotti | 428/34 |

FOREIGN PATENT DOCUMENTS

| | | |
|---|---|---|
| 0336257 | 10/1985 | European Pat. Off. |
| 0183052 | 6/1986 | European Pat. Off. |
| 0332717 | 9/1989 | European Pat. Off. |
| 2586245 | 2/1987 | France |
| 3191063 | 8/1991 | Japan |

OTHER PUBLICATIONS

WPIL, 84-059802, & JP-A-59-018-134, Jan. 30, 1984, (Filed Feb. 27, 1992) Abs. only.
WPIL, 89-003563, & JP-A-63-281-204, Nov. 17, 1988, (Filed Feb. 27, 1992) Abs. only.
Solar Energy Materials, vol. 19, Nos. 1/2, pp. 55–65, Sep., 1989, R. C. Ross, et al., "Plasma Oxidation of Silver and Zinc in Low-Emissivity Stacks".

Primary Examiner—A. A. Turner
Assistant Examiner—Timothy M. Speer
Attorney, Agent, or Firm—Oblon, Spivak, McClelland, Maier, & Neustadt

[57] ABSTRACT

A low emissivity film formed on a substrate, which comprises a coating of oxide films and films whose major component is Ag alternately formed on the substrate in a total of (2n+1) layers where n is an integer being equal to or more than 1, with the innermost layer being an oxide film, wherein an integral width $\beta i(°)$ of (111) diffraction line of a cubic Ag in an X-ray diffraction diagram of the low emissivity film exists in a first range of $180\lambda/(d\pi\cos\theta) \leq \beta i \leq 180\pi/(d\pi\cos\theta)+0.15$, where $d(Å)$ designates a thickness of a film whose major component is Ag, $\pi(Å)$, a wave length of an X-ray for measurement and $\theta$, Bragg angle.

6 Claims, 3 Drawing Sheets

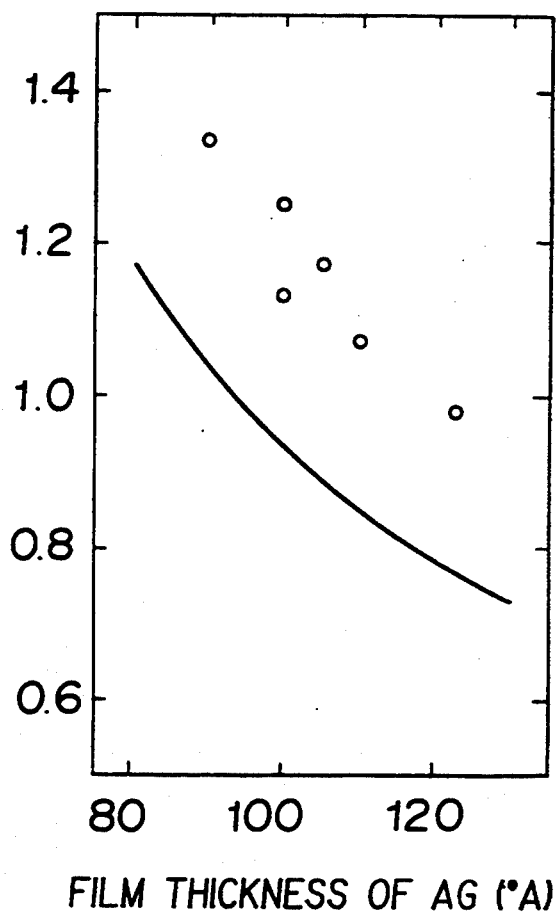

LOW EMISSIVITY FILM

This application is a continuation-in-part application of the application Ser. No. 07/726,263 having a filing date of Jul. 5, 1991.

BACKGROUND OF THE INVENTION

1. Field of the Invention

The present invention relates to a low emissivity film which is excellent in durability, especially in moisture resistance.

2. Discussion of Background

A film composed of (2n+1) layers (n≧1) such as a film composed of three layers in which an oxide film, an Ag film, and an oxide film are successively coated on a surface of a substrate, or a film composed of five layers in which an oxide film, an Ag film, an oxide film, an Ag film and an oxide film are successively coated on a surface of a substrate, is a heat mirror film of Low-E (Low-Emissivity) film. A glass in which such a low-E film is formed, is called a Low-E glass. This glass can prevent lowering of room temperature by reflecting the thermal infrared radiation emitted from within a heated room, which is mainly used in cold district in a form of double glazing for the purpose of decreasing heating load. Furthermore, since this glass has a heat insulating effect of the solar radiation energy, it is adopted in a windshield of an automobile in a form of laminated glass. Since this glass is transparent and is electrically conductive, it has a utility as an electromagnetic shielding glass. When this glass is equipped with an electric heating means such as a bus bar composed of an electrically conductive printing or the like, this glass can be used as an electrically heated window for defogging and deicing.

In the conventional Low-E glass, white dot or white turbidity is caused, by moisture in the air or by moisture contained in an intermediate plastic film in case of the laminated glass. Therefore, caution is required in the long term storage or in handling of a single plate having the Low-E film, before it is transformed into the double glazing or the laminated glass.

A detailed investigation on the deteriorated portion of the conventional Low-E glass (film composition: ZnO/Ag/ZnO/glass) reveals that damage of the film such as wrinkle, or crack, or exfoliation takes place on the outermost layer of the oxide film. Furthermore, it is found that considerable grain growth of Ag takes place. From these facts, the mechanism of the generation of the white turbidity is found to be as follows. The outermost layer of the oxide film can not resist with internal stress of the film, is exfoliated from an interface with an Ag film, and is destroyed. Next the grain size of Ag increases. Light is scattered by the destroyed surface and the large Ag grain, which causes the white turbidity in appearance.

Therefore, the inventors found that decreasing the internal stress of the oxide film, as a measure for improving the moisture resistance, is extremely effective. (described in Japanese Patent Application No. 191063/1991) By this measure, the durability of the film is considerably improved. However, it is necessary to further enhance it.

SUMMARY OF THE INVENTION

It is an object of the present invention to provide a Low-E glass excellent in the durability thereof, especially in the moisture resistance thereof, by solving the above shortcomings of the conventional technology.

According to an aspect of the present invention, there is provided a low emissivity film formed on a substrate which comprises: a coating of oxide films and films whose major component is Ag alternately formed on the substrate in a total of (2n+1) layers where n is an integer being equal to or more than 1, with the innermost layer being an oxide film, wherein an integral width $\beta i(°)$ of (111) diffraction line of a cubic Ag in an X-ray diffraction diagram of the low emissivity film exists in a first range of $180\lambda/(d\pi\cos\theta) \leq \beta i \leq 180\lambda/(d\pi\cos\theta)+0.15$, where $d(Å)$ designates a thickness of a film whose major component is Ag, $\lambda(Å)$, a wave length of an X-ray for measurement and $\theta$, Bragg angle.

A more preferable range of the integral width $\beta i(°)$ of (111) diffraction line of a cubic Ag is $180/(d\pi\cos\theta) \leq \beta i \leq 180\lambda/(d\pi\cos\theta)+0.10$.

The most preferable range of the integral width $\beta i(°)$ is $180/(d\pi\cos\theta) \leq \beta i \leq 180\lambda/(d\pi\cos\theta)+0.05$.

BRIEF EXPLANATION OF THE DRAWINGS

FIG. 2 is a graph showing a relationship between the film thickness of an Ag film and the integral width of (111) diffraction line of cubic Ag;

DETAILED EXPLANATION OF THE PREFERRED EMBODIMENTS

Figure 1A:
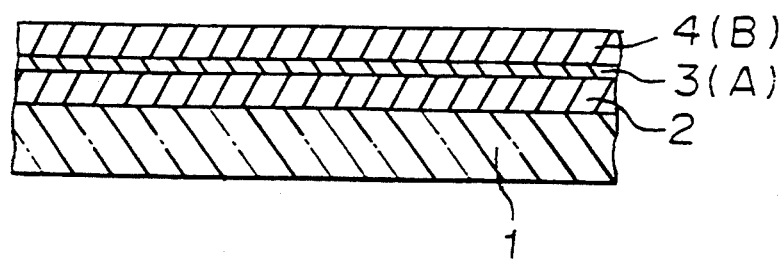
FIGS. 1A, 1B and 1C are cross sectional diagrams showing examples of Low-E glasses on which Low-E films are formed.

This invention improves the moisture resistance of the Low-E film by improving imperfection of Ag crystal, and by stabilizing Ag. The moisture resistance can further be improved by combining the oxide film 4 having low internal stress, with the Ag layer.

Explanation will be given in details in the following on the relationship between the stability of Ag and the deterioration of the Low-E film.

A moisture resistance test was performed on a conventional Low-E film (ZnO/Ag/ZnO/glass). In this moisture resistance test, the sample is left in an atmosphere of 50° C. in temperature and 95% in relative humidity for 6 days. White dots and white turbidity are found in the Low-E film after the moisture resistance test. Investigation is performed on the Low-E film before and after the moisture resistance test by X-ray diffraction method. Table 1 shows respectively the diffraction angle $2\theta$ (center of gravity position of X-ray diffraction peak), the interplanar spacing $d_{111}$, and the integral width $\beta i$, concerning (111) diffraction line of cubic Ag.

TABLE 1

|  | Before moisture test | After moisture test |
| --- | --- | --- |
| $2\theta$ (°) | 38.09 | 38.09 |
| $d_{111}$ (Å) | 2.361 | 2.361 |
| $\beta i$ (°) | 0.977 | 0.675 |

According to Table 1, concerning (111) diffraction line of Ag, after the moisture resistance test, the integral width βi is decreased to a large extent, and the diffraction peak becomes considerably sharp. This shows that the crystallite size of Ag is considerably increased. (That is, the crystallite size becomes larger than the film thickness.) The increase of the grain size and the agglomeration of Ag is recognized by the observation of the sample by a SEM (scanning electron microscope) of the Low-E film after the moisture resistance test. In this specification, crystallite designates a crystal particle recognized by an X-ray, and grain designates a particle aggregated with the crystallite recognized by an SEM. From this observation, it is found that the Ag film is changeable and unstable.

The Low-E film is liable to be deteriorated due to the instability of such Ag. This is due to the following two reasons.

First of all, exfoliation of the oxide film is liable to take place at the interface between Ag and the oxide, and the outermost layer of the oxide film is liable to be destroyed. The portion wherein the oxide film is exfoliated and destroyed appears to be the white turbidity. (This phenomena is naturally significant when the internal stress of the oxide film is large. The fact that the deterioration can be prevented by lowering the internal stress of the oxide film, was mentioned in details in Japanese Patent Application No. 191063/1991).

Secondly, in addition to the destruction of the oxide film, the grain growth of Ag and the agglomeration thereof take place, by which the degree of white turbidity becomes more and more conspicuous. This is also due to the instability of Ag.

When Ag is stabilized, exfoliation of the oxide film is hard to take place at the interface between Ag and the oxide. Therefore, the destruction of the outermost layer of the oxide film is hard to take place. Even when the outermost layer of the oxide film is exfoliated, the degree of the white turbidity is not so conspicuous since the grain of Ag does not considerably grow and agglomerate. As a result the deterioration of the Low-E film is prevented.

From above reasonings, it is found that the stabilization of Ag is indispensable for improving the durability of the Low-E film.

A search is performed by observing the X-ray diffraction line, on the imperfection of Ag crystal, and the relationship between the stability of Ag and the observation result is mentioned as follows.

Scherrer introduced the following experiment formula concerning a general crystal, assuming that there is no imperfection in crystal and the spacing of the profile depends only on the crystallite size, and presuming that the crystallite size is uniform.

$$D_{hkl} = K \cdot 180\lambda/(\pi \beta i \cos\theta)$$

where $D_{hkl}$ (Å) is a crystallite size perpendicular to hkl, K, a constant, λ (Å), an X-ray wave length for measurement, βi (°), an integral width, and θ, a Bragg angle of a diffraction angle (2θ is peak position). When βi signifies the integral width, K is about 1.

Generally speaking, an Ag film coated by a sputtering method is liable to be oriented in (111) plane parallel to the substrate. Accordingly, normally, only (111) diffraction line of Ag is observed.

When Ag is a perfect crystal in the direction perpendicular to the substrate, the crystallite size in the direction perpendicular to the substrate is the same as the film thickness. In case of the above (111) plane oriented in parallel to the substrate, the crystallite size $D_{111}$ is equal to the film thickness. Therefore, the film thickness and the integral width are defined by the following equation.

$$d = D_{111} = 180\lambda/(\pi \beta i \cos\theta)$$

Therefore, $$\beta i = 180\lambda/(d\pi \cos\theta) \quad (1)$$

FIG. 2 shows the relationship between the film thickness of Ag and the integral width of (111) diffraction line of Ag. The bold line shows the relationship as shown in equation (1). Each dot signifies a measured value in the conventional ZnO/Ag/ZnO/glass.

When Ag is of a perfect crystal in the direction perpendicular to the substrate, the integral width of (111) diffraction line of Ag should approximately agree with the bold line in FIG. 2. However, FIG. 2 shows that the measured value of the integral width of the conventional Low-E film are larger than that of the bold line.

The main reason that integral width is enlarged, is that the Ag crystal is not a perfect crystal, and contains imperfection such as ununiform distortion or defect.

Due to the imperfection of the crystal, Ag becomes unstable then oxide film is liable to be exfoliated and the grain growth of Ag is liable to take place. As the result, the moisture resistance of the Low-E film is deteriorated, and white turbidity or white dot is generated.

In this invention, it is found that alleviation of the imperfection of the Ag crystal is effective for preventing the white turbidity or the white dot due to moisture.

Table 2 shows the relationship among the integral width βi of (111) diffraction line of cubic Ag of the Low-E film before the moisture resistance test, the ratio of change of integral width of the Low-E film after the moisture resistance test in comparison to the integral width before the moisture resistance test, and the moisture resistance. Every uppermost layer of the ZnO film and every Ag film are produced under the same condition. The film thickness of the Ag film is 100 Å. The internal stress of the uppermost layer of ZnO film is $1.2 \times 10^{10}$ dyn/cm². In samples 4 and 5, heat treatment of 200° to 300° C. is performed after the film deposition. When the samples are investigated by X-ray diffraction method, almost no change is found on the peak position of (002) diffraction line of hexagonal ZnO before and after the heat treatment. From this fact, it seems that there is almost no change in the internal stress of ZnO film.

The moisture resistance of sample is evaluated by performing the test in which the sample is left in an atmosphere of 50° C. in temperature and 95% in relative humidity for 6 days. As the evaluation standard, ○ is for a sample having no white turbidity at adjacent to the edge of the film, and white dot with a diameter less than 1 mm or no white dot, Δ for a sample having no white turbidity at adjacent to the edge of the film, and white dot with a diameter of 1 to 2 mm, and X for a sample having white turbidity at adjacent to the edge of the film, or white dot with a diameter of more than 2 mm.

From Table 2, it is found that the moisture resistance depends on the integral width βi of (111) diffraction line of cubic Ag of the Low-E film before the moisture resistance test.

TABLE 2

| | Layer system of Low-E film (numerals: film thickness (Å)) | Integral width (°) of Ag(111) diffraction line | Ratio of change of integral width of Ag(111) diffraction line (%) | Moisture resistance |
|---|---|---|---|---|
| 1 | ZnO/Ag/G 450 100 | 1.75 | 63.5 | X |
| 2 | ZnO/Ag/Ti/Zno/G 450 100 40 450 | 1.25 | 48.2 | X |
| 3 | ZnO/Ag/ZnO/G 450 100 450 | 1.12 | 14.4 | Δ |
| 4 | ZnO/Ag/Ti/ZnO/G 450 100 40 450 | 1.03 | 7.1 | ○ |
| 5 | ZnO/Ag/ZnO/G 450 100 450 | 0.95 | 0.3 | ○ |

When the integral width is small and approximately equal to 0.93 which is a value calculated from equation (1) when the film thickness of Ag is 100 Å, that is, when the crystallite size in the direction perpendicular to the substrate is approximately equal to the film thickness (that is, imperfection of crystal is not considerable), the change of (111) diffraction line of Ag after the moisture resistance test in comparison to that of before the test is small and Ag is stable.

Figure 3:
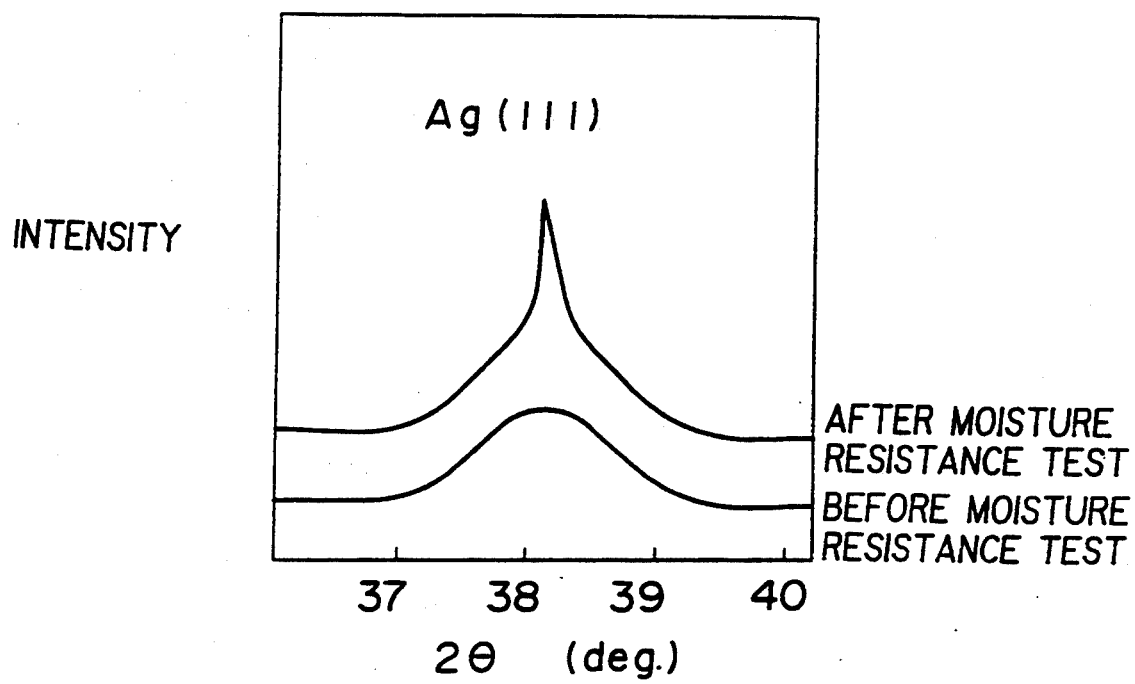
FIG. 3 is an X-ray diffraction diagram showing change of profile of (111) diffraction line of Ag before and after the moisture resistance test of sample 2.
Figure 4:
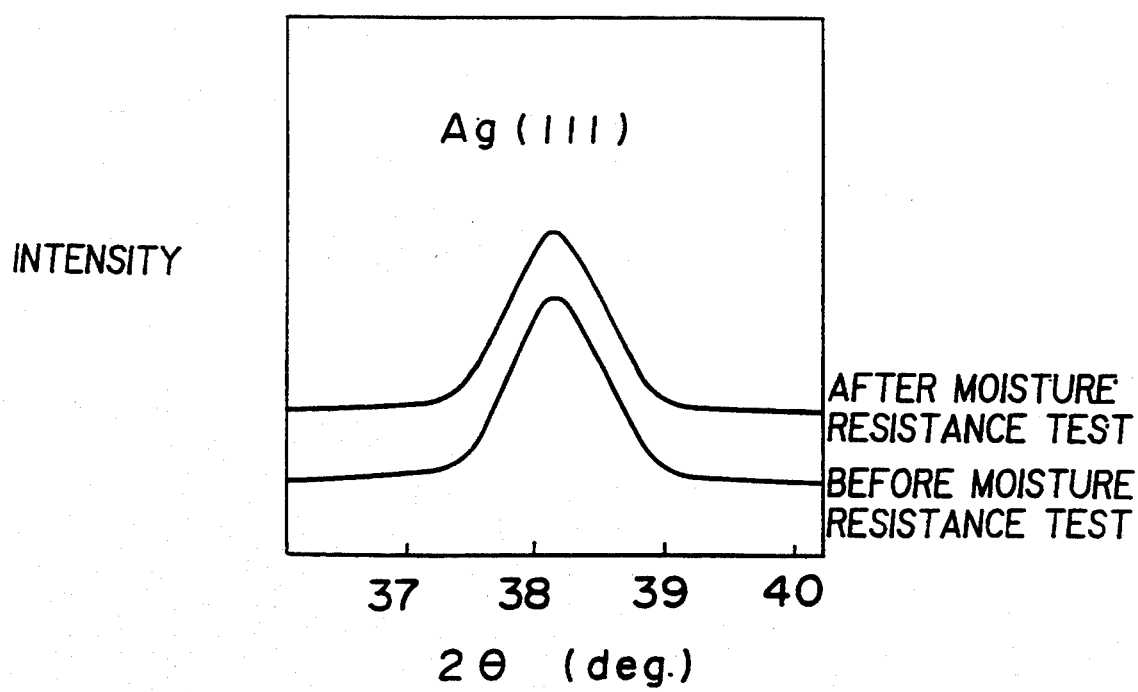
FIG. 4 is an X-ray diffraction diagram showing change of profile of (111) diffraction line of Ag before and after the moisture resistance test of sample 5.

FIGS. 3 and 4 show the change of the profile of (111) diffraction line of Ag before and after the moisture resistance test in X-ray diffraction diagrams of samples 2 and 5, respectively.

Furthermore, in FIGS. 3 and 4, the profiles after moisture resistance test are shifted with respect to the profiles before moisture resistance test, in order to clearly show the change of profiles before and after moisture resistance test. Moreover, FIGS. 3 and 4 show only the relative change of the profile, and do not necessarily show the absolute values of the intensity.

In the conventional Low-E film which is deteriorated and which has white turbidity caused by the moisture resistance test, and in the Low-E film of the present invention in which the imperfection of Ag crystal is alleviated, both integral widths of (111) diffraction line of Ag are small, compared with the conventional Low-E film before the deterioration. However, as shown in FIGS. 3 and 4, there is a clear difference in the profiles of X-ray diffraction. In a sample which is deteriorated and which has the white turbidity by the moisture resistance-test, the peak top thereof is sharp as shown in FIG. 3. In case of the sample of the present invention in which the integral width is narrowed by removing the imperfection of Ag crystal, the shape of the peak does not change and is smooth as shown in FIG. 4.

Furthermore, as mentioned above, when the conventional Low-E film is deteriorated, the grain growth of Ag or the agglomeration of Ag crystal is observed by a SEM (scanning electron microscope), which is clearly differentiated from the Low-E film of the present invention.

Normally, since the crystallite size in the direction perpendicular to the substrate varies with the film thickness of Ag, naturally, so does the integral width. Accordingly, the optimum value of the integral width of Ag crystal changes with the film thickness of Ag. Table 3 shows the relationship between the integral width of (111) diffraction line of cubic Ag and the moisture resistance when the film thickness of Ag in the Low-E film (ZnO/Ag/ZnO/glass), is changed. The evaluation standard of the moisture resistance is the same as in the above Table 1.

TABLE 3

| Film thickness of Ag (Å) | Integral width (°) | Moisture resistance |
|---|---|---|
| 90 | 1.34 | X |
| | 1.20 | Δ |
| | 1.05 | ○ |
| | (1.03) | |
| 100 | 1.25 | X |
| | 1.12 | Δ |
| | 0.95 | ○ |
| | (0.93) | |
| 110 | 1.07 | X |
| | 1.01 | Δ |
| | 0.84 | ○ |
| | (0.84) | |

The values in the parentheses in Table 3 are the values wherein the peak position $2\theta=38.11$ of (111) diffraction line of Ag powder in case of X-ray diffraction by CuKα radiation ($\lambda=1.54$ Å), is put into the equation (1).

Figure 1B:
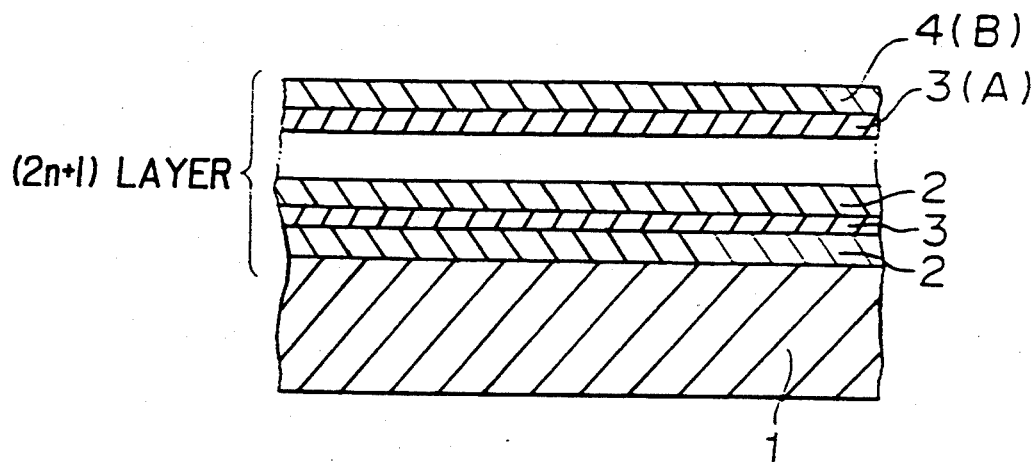
Figure 1C:
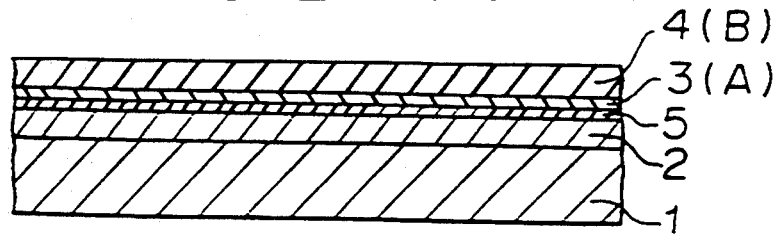

FIGS. 1A, 1B and 1C are cross sectional diagrams showing representative embodiments of the Low-E film according to the present invention. FIG. 1A is a cross sectional diagram of the Low-E film composed of three layers, FIG. 1B, a cross sectional diagram of the Low-E film composed of (2n+1) layers, and FIG. 1C, a cross sectional diagram of the Low-E film wherein the interstitial layer 5 is interposed between the film 3 whose major component is Ag, and the oxide film 2. A reference numeral 1 designates a substrate, 2, an oxide film, 3, a film whose major component is Ag (hereinafter, Ag film 3), 4, the oxide film (B) formed on the outer side of the Ag film 3 (A) being most apart from the substrate, and 5, an interstitial layer for alleviating the imperfection of the Ag crystal.

As for the material of the Ag film 3 whose major component is Ag, an Ag film, or a film whose major component is Ag containing at least one selected from the group consisted of Au, Cu, and Pd, can be utilized.

The film thickness of the Ag film 3 is desirable to be 80 to 160 Å, preferably 90 to 120 Å, considering a balance between the high heat reflective function and the visible light transmittance of Low-E film.

In the Low-E film according to the present invention, the integral width $\beta i(°)$ of (111) diffraction line of cubic Ag in the X-ray diffraction diagram of the Low-E film, is desirable to be in the range of $180\lambda/(d\pi\cos\theta) \leq \beta i \leq 180\lambda/(d\pi\cos\theta)+0.15$, more preferably, $180\lambda/(d\pi\cos\theta) \leq \beta i \leq 180\lambda/(d\pi\cos\theta)+0.10$ and the most preferably, $180\lambda/(d\pi\cos\theta) \leq \beta i \leq 180\lambda/(d\pi\cos\theta)+0.05$, where d(Å) designates the thickness of the Ag layer 3 whose major component is Ag, $\lambda$ (Å), the wave length of the X-ray for measurement, and $\theta$, Bragg angle ($2\theta$ is peak position).

Furthermore, the X-ray diffraction analysis in this specification is performed by using an X-ray diffraction apparatus, RU200-RINT (with a diffracted beam curved crystal monochromator, Rigaku CN2726A1) of RIGAKU Company. The measurement is performed by utilizing CuKα radiation, in step scanning by every 0.002°. In calculating the value of the integral width $\beta i$, correction for removing the influence of the instrumental broadening of the profile, is performed.

In the Low-E film according to this invention, when there are a plurality of layers of the film 3 whose major component is Ag, the mean thickness value of the respective Ag films 3 is considered to be regarded as the thickness d in the equation $$(180\lambda/(d\pi\cos\theta) \leq \beta i \leq 180\lambda/(d\pi\cos\theta)+0.15.$$

This invention concerns with the crystallized Ag film, and promotes the corrosion resistance of the Ag film by diminishing the incompleteness of the crystal. Accordingly, the effect of the present invention shows especially in the crystalline Ag film. In the X-ray diffraction of the crystalline Ag film, the peak of (111) diffraction line shows significantly. The intensity I of the peak top is frequently a large value, in comparison with the intensity of background, as shown in, $$I - I_b \geq 0.5 n I_b \qquad (2)$$

(where n designates number of layers of the film 3 whose major component is Ag).

However, when the Low-E film comprises two or more films 3 whose major component is Ag, equation (2) is applied to the case wherein the film thicknesses of the respective layers are almost equal. When the thicknesses of the respective layers are significantly different, equation (2) is not applicable. An Ag film showing small peak intensity I, wherein $I - I_B \leq 0.5 n I_B$, is considered to be in a state of partial crystallization, a state of amorphous. The X-ray diffraction data of Ag in this specification (including Examples, Comparative Examples, and data in Tables 1 to 3), show values of profiles wherein significant peaks which satisfy equation (2) are recognized.

As for the methods of forming the Ag film 3 wherein the imperfection of the crystal is alleviated, the heat treatment of at least about 200° C. during or after the film deposition, or forming the interstitial layer 5 which alleviates the imperfection of the Ag crystal on one side or both sides of the interface between the Ag film 3 and the oxide film, are proposed. Furthermore, the method depends on the film deposition condition of the Ag film 3, or the kind and the film forming condition of the interstitial layer 5. The respective concrete condition may be chosen according to each film deposition device and is not particularly restricted.

As an interstitial layer 5 which alleviates the imperfection of Ag crystal, a film which is easy to crystallize and in which the inter-atomic distance in the crystal plane parallel to the substrate is approximately equal to that of Ag lattice, is desirable. The film in the hexagonal system in which the C axis is easy to be orientated perpendicular to the substrate, or the film in the cubic system (face centered cubic lattice, diamond-type, NaCl-type) which is easy to be oriented in (111) plane parallel to the substrate, has tendency to promote the crystallization of Ag. As the examples, Ti, Zr, and ZnO liable to be oriented in (001) plane parallel to the substrate, TiN, ZrN, Pt, Au, Al, and Pd liable to be oriented in (111) plane parallel to the substrate, are pointed out. Even in using the same film material, the degree of the crystalline perfection and the orientation differ depending on the deposition condition thereof, or the degree of the crystalline perfection of the under lying layer (oxide film 2), and the stability of Ag varies with these factors. Furthermore, when the oxide film 2 or the oxide film 4 is composed of a single layer of ZnO, or when these layers are composed of multi-layers and have a ZnO film at the interface with the Ag film 3, the interstitial layer 5 can be dispensed with, since, these ZnO films show the effect similar to the interstitial layer 5.

The film thickness of the interstitial layer 5 is not particularly restricted. When it is too thin, the effect of decreasing the crystalline imperfection of Ag is reduced. When it is too thick, it influences on the total color hue of the Low-E film, and reduces the visible light transmittance. Considering these factors, the thickness of the interstitial layer 5 is desirable to be 10 to 40 Å.

The interstitial layer 5 functions to alleviate the incompleteness of the crystallized Ag film, and is different from the conventionally known nucleating layer, which is utilized in order to provide coalescence at the beginning of the formation of a film to be deposited on the nucleating layer and thereby ensure a smooth and thin continuous layer.

The material of the film 2 is not particularly restricted. It is possible to utilize a film composed of a single layer made of ZnO, $SnO_2$, $TiO_2$ etc., or composite of these materials, or these materials added with other elements, a multi-layer film comprising at least two of the above films. However, considering the productivity thereof, it is desirable to utilize a ZnO film, a $SnO_2$ film, a ZnO film added with at least one selected from the group consisted of Al, Si, B, Ti, Sn, Mg and Cr, by 10 atomic % or less in total quantity including Zn, or a multi-layer film in which ZnO and $SnO_2$ are alternatively laminated.

The oxide film 2 influences Ag crystal, directly, or indirectly through the interstitial layer 5. Therefore, as the oxide film 2, a crystalline film is desirable in order to promote the crystallization of the Ag film 3.

As the oxide film 4, a film similar to the above oxide film 2 can be utilized. Furthermore, when a laminated glass is produced by laminating another substrate on the Low-E glass interposing an intermediate plastic film, (for example, polyvinyl butyral), the oxide film 4 may be composed of a multi-layer film, and may be comprising an oxide film (for instance, chrominum oxide) of the film thickness of 100 Å or less, is formed, as a layer contacting the intermediate plastic film for the purpose of controlling the adhesive strength between the Low-E film and the intermediate plastic film, or for the purpose of increasing the durability of the laminated glass. In this case, the oxide film 4 may be composed of two layers or more including these films.

When the internal stress of the oxide film 4 is large, the film is liable to be exfoliated and destroyed, which causes the deterioration of the Ag film 3 (especially Ag film (A)). Accordingly, it is desirable that the internal stress of the total of the oxide film 4 is $1.1 \times 10^{10}$ $dyn/cm^2$ or below. When the oxide film 4 has a film whose major component is ZnO, and when the internal stress is small, the value of the diffraction line $2\theta$ (center of gravity position) of (002) diffraction line of hexagonal ZnO by X-ray diffraction method utilizing $CuK\alpha$ radiation, of the Low-E film is not smaller than 33.88° and not larger than 35.00°.

Especially, in case of the Low-E film comprising five layers of an oxide film 2, a metallic film, an oxide film 2, a metallic film, and an oxide film 4, or of more than five layers, the internal stress of the oxide film 2 other than the oxide film 4, is also desirable to be $1.1 \times 10^{10}$ $dyn/cm^2$ or less, for improving the moisture resistance thereof.

The film thicknesses of the oxide film 2 and the oxide film 4 are desirable to be in the range of 200 to 700 Å, considering the total color hue and the visible light transmittance of the Low-E film. In case the oxide film 2 and the oxide film 4 are composed of a multi-layer film, a total film thickness of the oxide film is desirable to be in the range of 200 to 700 Å, and the film thicknesses of the respective layers are not restricted.

As the substrate 1 of the present invention, a glass substrate, a film or a substrate made of plastics or the like may be utilized.

EXAMPLE 1

A ZnO film, an Ag film, and a ZnO film are successively deposited on a glass substrate, with the film thicknesses of 450 Å, 100 Å, and 450 Å, respectively, by the RF sputtering method. In this Example, during deposition of a ZnO film as the first layer the temperature of the substrate is set at 200° C.

A ZnO target and an Ag target are used and the sputtering is performed in an atmosphere of argon gas. The film deposition of the first layer of ZnO is performed under the sputtering pressure of $5.0 \times 10^{-2}$ Torr, with the RF power density of 1.8 W/cm$^2$, at the substrate temperature of 200° C. The film deposition of Ag is performed under the sputtering pressure of $3.0 \times 10^{-3}$ Torr, with the RF power density of 1.1 W/cm$^2$, at the substrate temperature of room temperature. The film formation of the third layer of ZnO is performed under the sputtering pressure of $1.0 \times 10^{-2}$ Torr, with the RF power density of 1.8 W/cm$^2$, and at the substrate temperature of room temperature.

The obtained Low-E film is examined by X-ray diffraction method utilizing RU200-RINT of RIGAKU Company (the same for the following Examples and Comparative Examples). The integral width of $\beta i$ of the (111) diffraction line of Ag is 0.98°.

The moisture resistance test (hereinafter the same test is performed in the following Examples, and Comparative Examples) is performed on the Low-E film, by leaving the sample in an atmosphere of 50° C. in temperature and 95% in relative humidity. The appearance of the sample after 6 days of the moisture resistance test, is fair wherein no conspicous white dot nor white turbidity is observed, although very small negligible dots are found partially.

EXAMPLE 2

A ZnO film, an Ag film, and a ZnO film are successively deposited on a glass substrate having respectively the film thicknesses of 450 Å, 100 Å, and 450 Å, by the RF sputtering method similar to the above Example 1. In this Example, the sample is heat-treated at 240° C. in vacuum after the film formation.

A ZnO target and an Ag target are used, and the sputtering is performed in an atmosphere of argon gas. The substrate temperature is set at room temperature during the deposition. The film deposition of the first layer and the third layer of ZnO is performed under the sputtering pressure of $1.0 \times 10^{-2}$ Torr, with the RF power density of 1.8 W/cm$^2$. The film deposition of the Ag layer is performed under the sputtering pressure of $3.0 \times 10^{-2}$ Torr, with the RF power density of 1.1 W/cm$^2$. The LOW-E film after the film deposition is heat-treated at 240° C. in vacuum for 1 hour. The Low-E film after the heat treatment is examined by X-ray diffraction method. The integral width $\beta i$ of (111) diffraction line of Ag is 0.95°.

The appearance of this Low-E film after 6 days of the moisture resistance test is excellent without any white dot or white turbidity observed.

Furthermore, a laminated glass is made by laminating another glass plate on top of the Low-E glass plate interposing a polyvinyl butyral intermediate film, with the Low-E film before the moisture resistance test being disposed inbetween, and the similar moisture resistance test is performed for this laminated glass. No white turbidity nor white dot is observed in the laminated glass after 14 days of the moisture resistance test.

EXAMPLE 3

A ZnO film, a Ti film, an Ag film, and a ZnO film, are successively deposited on the glass substrate having respectively the film thicknesses of 450 Å, 40 Å, 100 Å, and 450 Å, by the RF sputtering method similar to the above Example 1. In this Example, the Ti film is formed as the interstitial layer 5, and the sample is heat-treated in vacuum after the film deposition of the Low-E film.

A ZnO target, a Ti target, an Ag target are used, and the sputtering is performed in an atmosphere of argon gas. The substrate temperature is at room temperature. The film deposition of the first layer and the fourth layer of ZnO is performed under the sputtering pressure of $1.0 \times 10^{-2}$ Torr, with the RF power density of 1.8 W/cm$^2$. The film formation of the Ag layer is performed under the sputtering pressure of $3.0 \times 10^{-3}$ Torr, with the RF power density of 1.1 W/cm$^2$. The film deposition of the Ti layer is performed under the sputtering pressure of $3.0 \times 10^{-3}$ Torr, with the RF power density of 1.8 W/cm$^2$. The Low-E film after deposition is heat-treated at 200° C. in vacuum for 1 hour.

The Low-E film after the heat treatment is examined by X-ray diffraction method. The integral width $\beta i$ of (111) diffraction line of Ag. is 1.03°.

The moisture resistance of the Low-E film is fair as in the above Examples.

EXAMPLE 4

An Al-doped ZnO film, an Ag film, and an Al-doped ZnO film are successively deposited on a glass substrate having respectively the thicknesses of 450 Å, 100 Å, and 450 Å, by the RF sputtering method similar to the above Example 1. In this Example, the Al-doped ZnO films are formed, as the oxide film 2 and the oxide film 4, and the Low-E film after the film formation is heat-treated in vacuum.

A ZnO target containing Al by 3.2 atomic % of the total quantity including Zn and an Ag target are used, and the sputtering is performed in an atmosphere of argon gas. The substrate temperature is at room temperature. The film deposition of the Al-doped ZnO films of the first and the third layers, is performed under the RF pressure of $1.0 \times 10^{-2}$ Torr, with the RF power density of 1.8 W/cm$^2$. The film deposition of the Ag layer is performed under the sputtering pressure of $3.0 \times 10^{-3}$ Torr, with the RF power density of 1.1 W/cm$^2$. The Low-E film after deposition is heat treated at 240° C. in vacuum for 1 hour.

The Low-E film after the heat treatment is examined by X-ray diffraction method. The integral width $\beta i$ of (111) diffraction line of Ag is 0.96°.

The appearance of the Low-E film after 6 days of the moisture resistance test, is excellent without any white dot or turbidity observed by human eyes.

COMPARATIVE EXAMPLE 1

A ZnO film, an Ag film, and a ZnO film are successively deposited having respectively the thicknesses of 450 Å, 100 Å, and 450 Å, by the RF sputtering method similar to the above Example 2.

A ZnO target and an Ag target are used, and the sputtering is performed in an atmosphere of argon gas. The sputtering pressure, the substrate temperature, and the RF power density in the film deposition of ZnO and Ag are similar to those in the above Example 2. In this Comparative Example, no heat treatment in vacuum after the film deposition as in sample 2 is not performed.

The obtained Low-E film is examined by X-ray diffraction method. The integral width $\beta i$ of (111) diffraction line of Ag is 1.12°.

On the Low-E film after 6 days of the moisture resistance test, conspicuous white dots with diameter of 1 mm or more are observed.

The Low-E film before the test is incorporated in a laminated glass as described in Example 2, and then the moisture resistance test is performed. On the laminated glass after 14 days of the moisture resistance test, the white turbidity having the width of 6 mm is observed from the periphery of the sample.

COMPARATIVE EXAMPLE 2

A ZnO film, a Ti film, an Ag film and a ZnO film, are successively deposited on a glass substrate having respectively the film thicknesses of 450 Å, 40 Å, 100 Å, and 450 Å, by the RF sputtering method similar to the above Example 3.

A ZnO target, a Ti target, an Ag target are used, and the sputtering is performed in an atmosphere of argon gas. The sputtering pressure, the substrate temperature, and the RF power density in the film deposition of the ZnO film, the Ti film and the Ag film are the same with those in the above Example 3. In this Comparative Example, the heat treatment in vacuum after the deposition as in Example 3 is not performed.

The obtained Low-E film is examined by X-ray diffraction method. The integral width Hi of (111) diffraction line of Ag is 1.25°.

As for the appearance of this Low-E film after 6 days of the moisture resistance test, the white turbidity and the conspicuous white dots with particle size of 1 mm or more are observed.

In the Low-E film of this invention, the moisture resistance is considerably improved. Therefore, the handling of the Low-E film on a single plate before it is incorporated in a double glazing, or a laminated glass can be facilitated. Furthermore, the possibility of a long term storage in a room as a single plate is realized. This leads to the promotion of the reliability of the Low-E glass for an automobile or for architectural use. Furthermore, since the Low-E film is not deteriorated by moisture contained in an intermediate plastic film when it is used in a laminated glass, it promotes durability of the laminated glass for an automobile or for architectural use.

Since the Low-E film of this invention comprises the film whose major component is Ag, it has electrical conductivity as well as the heat reflective function. Therefore, this Low-E film of the present invention, can be utilized in various fields of technology utilizing this electric conductivity. For instance, it can be utilized as an electrode (for example, electrode for solar cell) in the field of electronics. Furthermore, in case of an electrically heating window, it can be used as a heating body. In case of a window or electronic components, it can be used as an electromagnetic shielding film. In some cases, the Low-E film of this invention can be formed on a substrate, interposing films with various functions therebetween. In such a case, the optical property thereof can be controlled by choosing the optical film thicknesses of the respective films of the Low-E film of the present invention, depending on the purpose.

What is claimed is:

1. A low emissivity film formed on a substrate, which comprises:

a coating of oxide films and films whose major component is Ag alternately formed on the substrate in a total of (2n+1) layers where n is an integer being equal to or more than 1, with the layer closest to the substrate being an oxide film, wherein an integral width $\beta i(°)$ of (111) diffraction line of a cubic Ag in an X-ray diffraction diagram of the low emissivity film exists in a range of $180\lambda/(d\pi\cos\theta) \leq \beta i \leq 180\lambda/(d\pi\cos\theta) + 0.15$, where d(Å) designates a thickness of a film whose major component is Ag, $\pi$(Å), a wave length of an X-ray for measurement and $\theta$, Bragg angle, wherein the Ag containing films have a thickness of 80 to 160 Å, and wherein the oxide films have a thickness of 200 to 700 Å and an internal stress of an oxide film most remote from the substrate equal to $1.1 \times 10^{10}$ dyne/cm² or less.

2. The low emissivity film according to claim 1, wherein the integral width $\beta i(°)$ exists in a range of $180\lambda/(d\pi\cos\theta) \leq \beta i \leq 180\lambda/(d\pi\cos\theta) + 0.10$.

3. The low emissivity film according to claim 1, wherein the integral width $\beta i(°)$ exists in a third range of $180\lambda/(d\pi\cos\theta) \leq \beta i \leq 180\lambda/(d\pi\cos\theta) + 0.05$.

4. The low emissivity film according to claim 1, further comprising: an interstitial layer or layers having thicknesses of 10 to 40 Å for alleviating the crystalline imperfection of Ag, formed at the interface between the film whose major component is Ag and the oxide film.

5. The low emissivity film according to claim 1, wherein the oxide film (B) formed on the outer side of the film (A) whose major component is Ag being most remote from the substrate, is composed of a single layer or a multi-layer, comprising at least a layer whose major component is zinc oxide, the crystal structure of the zinc oxide being hexagonal, and a value of a diffraction angle $2\theta$ (center of gravity position) of (002) diffraction line of the hexagonal zinc oxide in X-ray diffraction method using CuK$\alpha$ radiation is not smaller than 33.88° and not larger than 35.00°.

6. The low emissivity film according to claim 1, wherein the oxide film (B) formed on the outer side of the film (A) whose major component is Ag being most remote from the substrate, is composed of a multi-layer film, the outermost layer of which is a controlling layer for controlling adhesive strength between the low emissivity film and an intermediate plastic film interposed for lamination with another substrate.

* * * * *